United States Patent
Yeh et al.

(10) Patent No.: US 9,196,315 B2
(45) Date of Patent: Nov. 24, 2015

(54) THREE DIMENSIONAL GATE STRUCTURES WITH HORIZONTAL EXTENSIONS

(71) Applicants: Teng-Hao Yeh, Hsinchu (TW); Yen-Hao Shih, New Taipei (TW); Yan-Ru Chen, Hsinchu (TW)

(72) Inventors: Teng-Hao Yeh, Hsinchu (TW); Yen-Hao Shih, New Taipei (TW); Yan-Ru Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 324 days.

(21) Appl. No.: 13/681,133

(22) Filed: Nov. 19, 2012

(65) Prior Publication Data

US 2014/0140131 A1     May 22, 2014

(51) Int. Cl.
| | | |
|---|---|---|
| G11C 11/34 | (2006.01) | |
| G11C 5/06 | (2006.01) | |
| H01L 21/28 | (2006.01) | |
| H01L 29/792 | (2006.01) | |
| H01L 27/115 | (2006.01) | |
| G11C 16/04 | (2006.01) | |

(52) U.S. Cl.
CPC ........ *G11C 5/06* (2013.01); *G11C 5/063* (2013.01); *G11C 16/0483* (2013.01); *H01L 21/28282* (2013.01); *H01L 27/1157* (2013.01); *H01L 27/11582* (2013.01); *H01L 29/7926* (2013.01); *G11C 2213/71* (2013.01)

(58) Field of Classification Search
CPC .................. H01L 27/115; H01L 27/1521
USPC ...................... 365/185.05, 163, 51
See application file for complete search history.

(56) References Cited

U.S. PATENT DOCUMENTS

| | | |
|---|---|---|
| 6,034,882 A | 3/2000 | Johnson et al. |
| 6,906,361 B2 | 6/2005 | Zhang |
| 6,906,940 B1 | 6/2005 | Lue |

(Continued)

FOREIGN PATENT DOCUMENTS

| | | |
|---|---|---|
| EP | 1936681 A1 | 6/2008 |
| EP | 2048709 A2 | 4/2009 |

OTHER PUBLICATIONS

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

(Continued)

*Primary Examiner* — Son Dinh
(74) *Attorney, Agent, or Firm* — Yiding Wu; Haynes Beffel & Wolfeld LLP

(57) ABSTRACT

A device on an integrated circuit includes a stack of alternating semiconductor lines and insulating lines, and a gate structure over the stack of semiconductor lines. The gate structure includes a vertical portion adjacent the stack on the at least one side, and horizontal extension portions between the semiconductor lines. Sides of the insulating lines can be recessed relative to sides of the semiconductor lines, so at least one side of the stack includes recesses between semiconductor lines. The horizontal extension portions can be in the recesses. The horizontal extension portions have inside surfaces adjacent the sides of the insulating lines, and outside surfaces that can be flush with the sides of the semiconductor lines. The device may include a second gate structure spaced away from the first mentioned gate structure, and an insulating element between horizontal extension portions of the second gate structure and the first mentioned gate structure.

20 Claims, 19 Drawing Sheets

(56) References Cited

U.S. PATENT DOCUMENTS

| | | |
|---|---|---|
| 7,081,377 B2 | 7/2006 | Cleeves |
| 7,129,538 B2 | 10/2006 | Lee et al. |
| 7,177,169 B2 | 2/2007 | Scheuerlein |
| 7,274,594 B2 | 9/2007 | Pascucci et al. |
| 7,315,474 B2 | 1/2008 | Lue |
| 7,382,647 B1 | 6/2008 | Gopalakrishnan |
| 7,420,242 B2 | 9/2008 | Lung |
| 7,851,849 B2 | 12/2010 | Kiyotoshi |
| 7,936,611 B2 | 5/2011 | Lee et al. |
| 8,188,517 B2 | 5/2012 | Choi |
| 8,310,864 B2 * | 11/2012 | Lung et al. .............. 365/163 |
| 2005/0280061 A1 | 12/2005 | Lee |
| 2007/0140001 A1 | 6/2007 | Motoi et al. |
| 2008/0073635 A1 | 3/2008 | Kiyotoshi et al. |
| 2008/0096327 A1 | 4/2008 | Lee et al. |
| 2008/0101109 A1 | 5/2008 | Haring-Bolivar et al. |
| 2008/0175032 A1 | 7/2008 | Tanaka et al. |
| 2008/0180994 A1 | 7/2008 | Katsumata et al. |
| 2008/0247230 A1 | 10/2008 | Lee et al. |
| 2008/0285350 A1 | 11/2008 | Yeh |
| 2009/0097321 A1 | 4/2009 | Kim et al. |
| 2009/0184360 A1 | 7/2009 | Jin et al. |
| 2010/0226195 A1 | 9/2010 | Lue |
| 2010/0270593 A1 | 10/2010 | Lung et al. |
| 2011/0140070 A1 | 6/2011 | Kim |
| 2012/0112260 A1 | 5/2012 | Kim et al. |
| 2012/0182806 A1 | 7/2012 | Chen et al. |

OTHER PUBLICATIONS

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Paul et al., "Impact of a Process Variation on Nanowire and Nanotube Device Performance," IEEE Trans. on Electron Devices, vol. 54, No. 9, Sep. 2007, pp. 2369-2376.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Fukuzumi et al. "Optimal Integration and Characteristics of Vertical Array Devices for Ultra-High Density, Bit-Cost Scalable Flash Memory," IEEE Dec. 2007, pp. 449-452.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

* cited by examiner

THREE DIMENSIONAL GATE STRUCTURES WITH HORIZONTAL EXTENSIONS

RELATED APPLICATION

This application is related to U.S. patent application Ser. No. 13/078,311, filed Apr. 1, 2011, which application is incorporated herein by reference as if fully set forth herein.

BACKGROUND OF THE INVENTION

1. Field of the Invention

The present invention relates to stacked transistor structures, such as can be used in high density three-dimensional (3D) memory devices, and memory devices utilizing such structures.

2. Description of Related Art

FIG. 1A is a perspective illustration of a 3D NAND-flash memory device, which is described in co-pending U.S. patent application Ser. No. 13/078,311, which application is incorporated by reference as if fully set forth herein. The device illustrated in FIG. 1A includes stacks of alternating semiconductor lines and insulating lines. Insulating material is removed from the drawing to expose additional structure. For example, insulating lines are removed between the semiconductor lines, in the stacks, and are removed between the stacks of semiconductor lines.

A multilayer array is formed on an insulating layer, and includes a plurality of word lines 325-1, . . . , 325-n conformal with the plurality of stacks. The plurality of stacks includes semiconductor lines 312, 313, 314, and 315 in multiple planes. Semiconductor lines in the same plane are electrically coupled together by bit line structures (e.g. 302B).

The word line numbering shown in FIG. 1A, ascending from 325-1 to 325-N going from the back to the front of the overall structure, applies to even memory pages. For odd memory pages, the word line numbering descends from 325-N to 325-1 going from the back to the front of the overall structure.

Bit line structures 312A, 313A, 314A, and 315A terminate semiconductor lines, such as semiconductor lines 312, 313, 314, and 315. As illustrated, these bit line structures 312A, 313A, 314A, and 315A are electrically connected to different bit lines for connection to decoding circuitry to select planes within the array. These bit line structures 312A, 313A, 314A, and 315A can be patterned at the same time that the plurality of stacks is defined.

Bit line structures 302B, 303B, 304B, and 305B terminate semiconductor lines, such as semiconductor lines 302, 303, 304, and 305. As illustrated, these bit line structures 302B, 303B, 304B, and 305B are electrically connected to different bit lines for connection to decoding circuitry to select planes within the array. These bit line structures 302B, 303B, 304B, and 305B can be patterned at the same time that the plurality of stacks is defined.

Any given stack of semiconductor lines is coupled to either the bit line structures 312A, 313A, 314A, and 315A, or the bit line structures 302B, 303B, 304B, and 305B, but not both. A stack of semiconductor bit lines has one of the two opposite orientations of bit line end-to-source line end orientation, or source line end-to-bit line end orientation. For example, the stack of semiconductor lines 312, 313, 314, and 315 has bit line end-to-source line end orientation; and the stack of semiconductor lines 302, 303, 304, and 305 has source line end-to-bit line end orientation.

The stack of semiconductor lines 312, 313, 314, and 315 is terminated at one end by the bit line structures 312A, 313A, 314A, and 315A, passes through SSL gate structure 319, ground select line GSL 326, word lines 325-1 WL through 325-N WL, ground select line GSL 327, and is terminated at the other end by source line 328. The stack of semiconductor lines 312, 313, 314, and 315 does not reach the bit line structures 302B, 303B, 304B, and 305B.

The stack of semiconductor lines 302, 303, 304, and 305 is terminated at one end by the bit line structures 302B, 303B, 304B, and 305B, passes through SSL gate structure 309, ground select line GSL 327, word lines 325-N WL through 325-1 WL, ground select line GSL 326, and is terminated at the other end by a source line (obscured by other parts of the figure). The stack of semiconductor lines 302, 303, 304, and 305 does not reach the bit line structures 312A, 313A, 314A, and 315A.

A layer of memory material is disposed in interface regions at cross-points between surfaces of the semiconductor lines 312-315 and 302-305 and the plurality of word lines 325-1 through 325-n. Ground select lines GSL 326 and GSL 327 are conformal with the plurality of stacks, similar to the word lines.

Every stack of semiconductor lines is terminated at one end by bit line structures and at the other end by a source line. For example, the stack of semiconductor lines 312, 313, 314, and 315 is terminated at one end by bit line structures 312A, 313A, 314A, and 315A, and terminated on the other end by a source line 328. At the near end of the figure, every other stack of semiconductor lines is terminated by the bit line structures 302B, 303B, 304B, and 305B, and every other stack of semiconductor lines is terminated by a separate source line. At the far end of the figure, every other stack of semiconductor lines is terminated by the bit line structures 312A, 313A, 314A, and 315A, and every other stack of semiconductor lines is terminated by a separate source line.

Bit lines and string select lines are formed at the metals layers ML1, ML2, and ML3. Bit lines are coupled to a plane decoder (not shown). String select lines are coupled to a string select line decoder (not shown).

The ground select lines GSL 326 and 327 may be patterned during the same step that the word lines 325-1 through 325-n are defined. Ground select devices are formed at cross-points between surfaces of the plurality of stacks and ground select lines GSL 326 and 327. The SSL gate structures 319 and 309 may be patterned during the same step that the word lines 325-1 through 325-n are defined. String select devices are formed at cross-points between surfaces of the plurality of stacks and string select (SSL) gate structures 319 and 309. These devices are coupled to decoding circuitry for selecting the strings within particular stacks in the array.

In three-dimensional memory (3D) devices, such as the one illustrated by FIG. 1A, there is a relatively high resistance in semiconductor lines (e.g. 312-315 and 302-305) passing through the SSL gate structures (e.g. 319 and 309) and the ground select lines GSL (e.g. 326 and 327), degrading performance of the 3D memory devices.

It is desirable to provide a 3D memory device with lower resistance in semiconductor lines passing through the SSL gate structures and the ground select lines.

SUMMARY

A device on an integrated circuit includes a stack of alternating semiconductor lines and insulating lines. Sides of the insulating lines can be recessed relative to sides of the semiconductor lines, so at least one side of the stack includes recesses between semiconductor lines. The device includes a gate structure over the stack of semiconductor lines, such as can be used for the SSL gate structure 319 described above. The gate structure includes a vertical portion adjacent the stack on the at least one side, and horizontal extension portions, which can be in the recesses, between the semiconductor lines. The horizontal extension portions have inside surfaces adjacent the sides of the insulating lines, and outside surfaces. The outside surfaces can be flush with the sides of the semiconductor lines.

The device may include a second gate structure, such as can be used for the ground select lines GSL 326 described above, which is spaced away from the first mentioned gate structure. The second gate structure includes a vertical portion adjacent the stack on the at least one side, and horizontal extension portions, which can be in the recesses, between the semiconductor lines. The device may include an insulating element between the horizontal extension portions of the second gate structure and the horizontal extension portions of the first mentioned gate structure.

Other aspects and advantages of the present invention can be seen on review of the drawings, the detailed description and the claims, which follow.

DETAILED DESCRIPTION

A three-dimensional memory device on an integrated circuit is described with the SSL (string select line) structures used as gates for string select switches, and the GSL (ground select line) structures used as gates for ground select switches, that reduce the resistance of the semiconductor lines in the stacks when the switches are on, using extended gate structures. The device includes a stack of alternating semiconductor lines and insulating lines. Sides of the insulating lines can be recessed relative to sides of the semiconductor lines, so at least one side of the stack includes recesses between semiconductor lines. The device includes a gate structure over the stack of semiconductor lines. The gate structure includes a vertical portion adjacent the stack on the at least one side, and horizontal extension portions, which can be in the recesses, between the semiconductor lines.

When voltage is applied to the gate structure, an inversion layer with lower resistance is formed in the semiconductor lines, beneath the gate structures in the normal channel region and, in addition, along the horizontal extension portions. The horizontal extension portions increase the length of the inversion region along the semiconductor lines. The horizontal extension portions can be embedded between semiconductor lines, and thereby have a low impact on memory array layout efficiency.

Figure 1A:
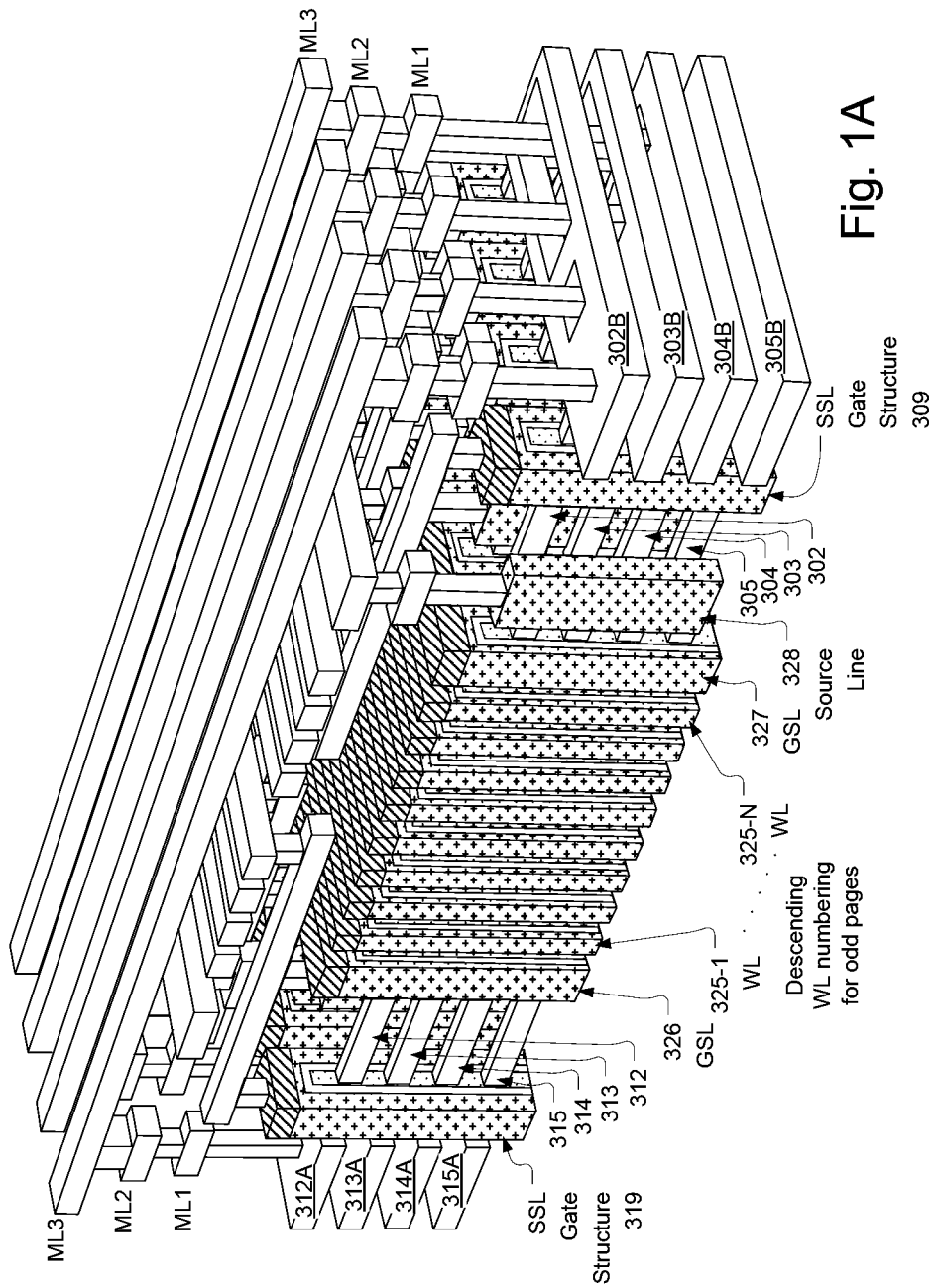
FIG. 1A is a perspective illustration of a 3D NAND-flash memory device.
Figure 1:
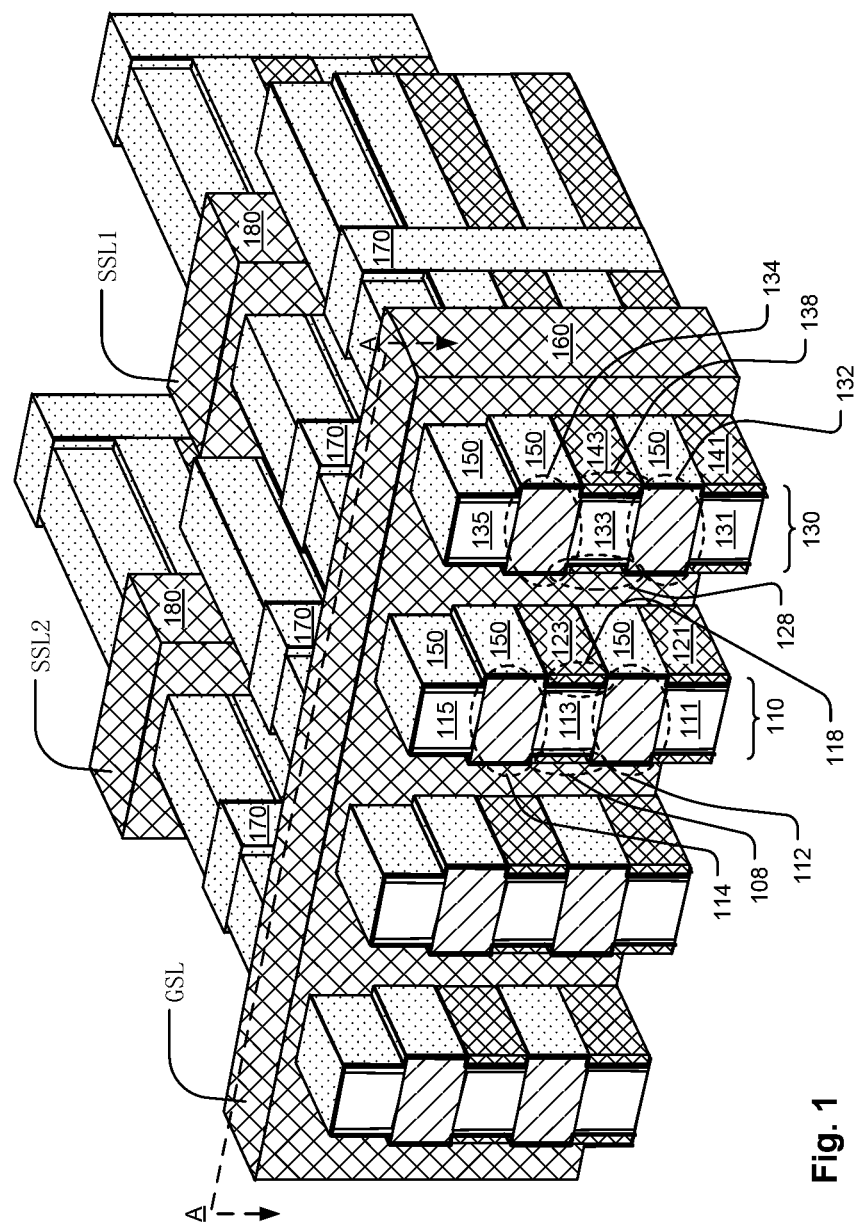
FIG. 1 is a perspective diagram illustrating stacks of semiconductor lines on an integrated circuit with gate structures in one embodiment of the present invention.

FIG. 1 is a perspective diagram illustrating stacks of semiconductor lines on an integrated circuit with gate structures in one embodiment of the present invention. The embodiment may employ a SSL/GSL ONO (string select line/ground select line oxide-nitride-oxide) approach as described herein. The device includes a stack of alternating semiconductor lines and insulating lines. The semiconductor lines may act as bit lines. For instance, a stack 110 among four stacks shown includes alternating semiconductor lines 112 and 114 and insulating lines 111, 113, and 115, while a stack 130 includes alternating semiconductor lines 132 and 134 and insulating lines 131, 133, and 135. Sides of the insulating lines are recessed relative to sides of the semiconductor lines in the example, so at least one side of the stack includes recesses between semiconductor lines. For instance, sides of the insulating lines 111, 113, and 115 are recessed relative to sides of the semiconductor lines 112 and 114, so the stack 110 includes recesses 108 and 118 between semiconductor lines 112 and 114. Similarly, sides of the insulating lines 131, 133, and 135 are recessed relative to sides of the semiconductor lines 132 and 134, so the stack 130 includes recesses 128 and 138 between semiconductor lines 132 and 134.

Figure 2:
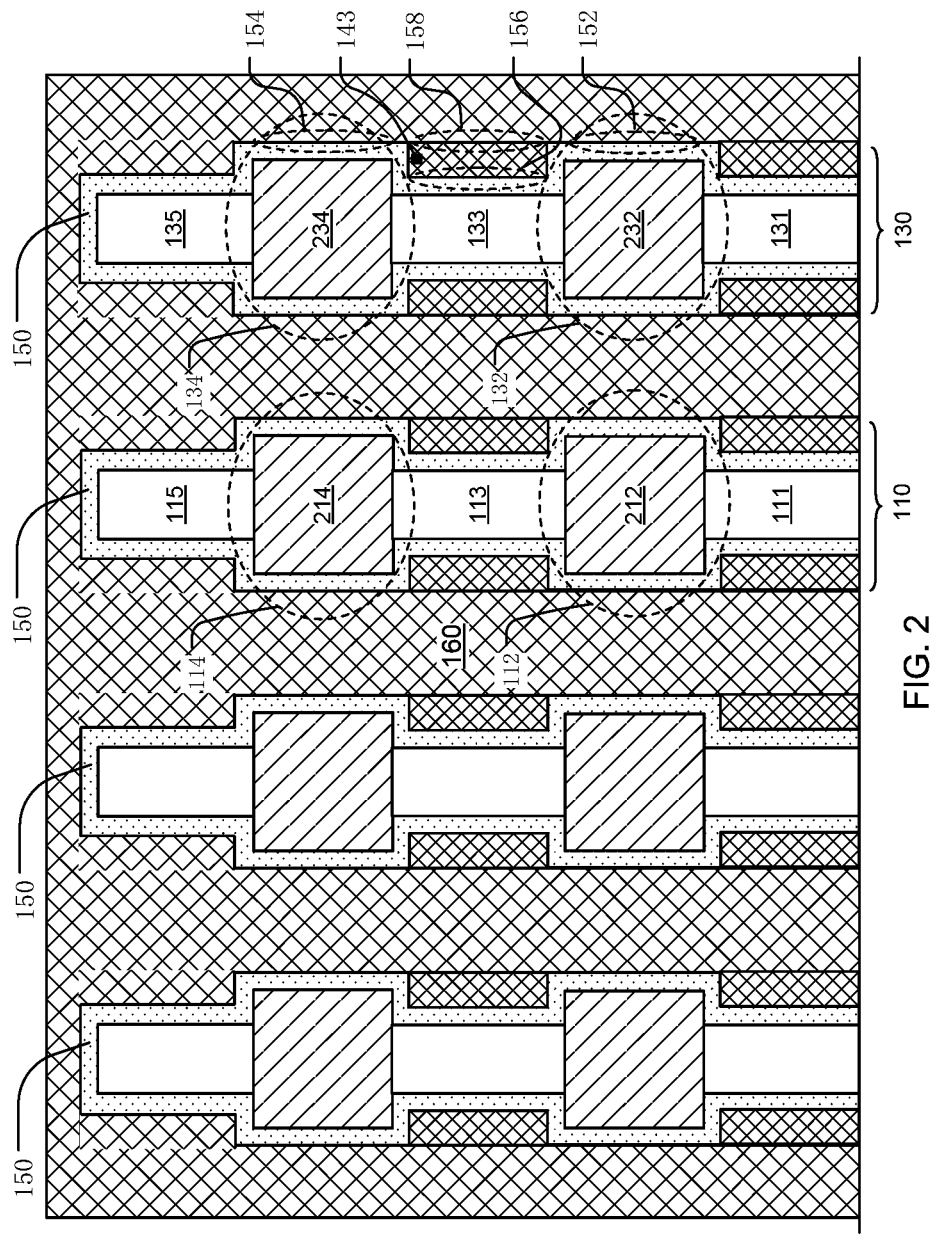
FIG. 2 is a cross-sectional diagram illustrating a cross-section of stacks in the device in FIG. 1.

As illustrated in FIG. 1, semiconductor lines 112, 114, 132, and 134 include a strip of semiconductor material having sides and a gate dielectric layer 150 on the sides of the semiconductor material. FIG. 2 further illustrates the semiconductor lines including the gate dielectric layer 150.

The device includes gate structures including a GSL gate structure which is part of the GSL line 327, and an SSL gate structure which is part of the SSL gate structure 309 over the stack of semiconductor lines. The gate structures include a vertical portion adjacent the stack on the at least one side, and horizontal extension portions in the recesses between the semiconductor lines. In some embodiments, the horizontal extension portions may not be within recesses.

As illustrated in FIG. 1, the GSL gate structure includes a vertical portion 160 adjacent the stack 130, and a horizontal extension portion 143 between the semiconductor lines 132 and 134 preferably in the recess 138. The vertical portion 160 is also adjacent the stack 110, and the stack 110 includes a horizontal extension portion 123 in the recess 118 between the semiconductor lines 112 and 114. The stack 110 and the stack 130 may include additional horizontal extension portions such as horizontal extension portions 121 and 141, between semiconductor lines 112 and 132 and the substrate at the bottom of the stacks.

FIG. 2 is a cross-sectional diagram illustrating a cross-section of stacks in the device in FIG. 1, taken along the line AA over the GSL gate structure and the stacks. Elements in FIG. 2 corresponding to elements in FIG. 1 are labeled with the same reference numerals.

The semiconductor lines in the stack may include a strip of semiconductor material having sides and a gate dielectric layer on the sides of the semiconductor material. Sides 152 and 154 of the semiconductor lines 132 and 134 are an outside surface of a gate dielectric layer 150. FIG. 2 illustrates semiconductor lines 112, 114, 132, and 134 including a strip of semiconductor material 212, 214, 232, and 234 having sides and a gate dielectric layer 150 on the sides of the strips of semiconductor material 212, 214, 232, and 234, respectively. Sides 152 and 154 of the semiconductor lines 132 and 134 are an outside surface of the gate dielectric layer 150 on the sides of the semiconductor material 232 and 234, respectively.

In the device, the horizontal extension portions have inside surfaces adjacent the sides of the insulating lines, and outside surfaces. The outside surfaces of the horizontal extension portions can be flush with the sides of the semiconductor lines. For instance, in reference to FIG. 2, in the stack 130, the horizontal extension portion 143 has an inside surface 156 adjacent the side of the insulating line 133, and an outside surface 158. The outside surface 158 can be flush with the sides 152 and 154 of the semiconductor lines 132 and 134, respectively.

The gate structures including the GSL gate structure and the SSL gate structure may be formed with anisotropic etches. Anisotropic etches produce sharp, well-controlled features, such that the outside surfaces of the horizontal extension portions of the gate structures can be vertically, or near vertically, planarized or flush with the overhanging sides of the semiconductor lines on sides of the stacks.

Figure 3:
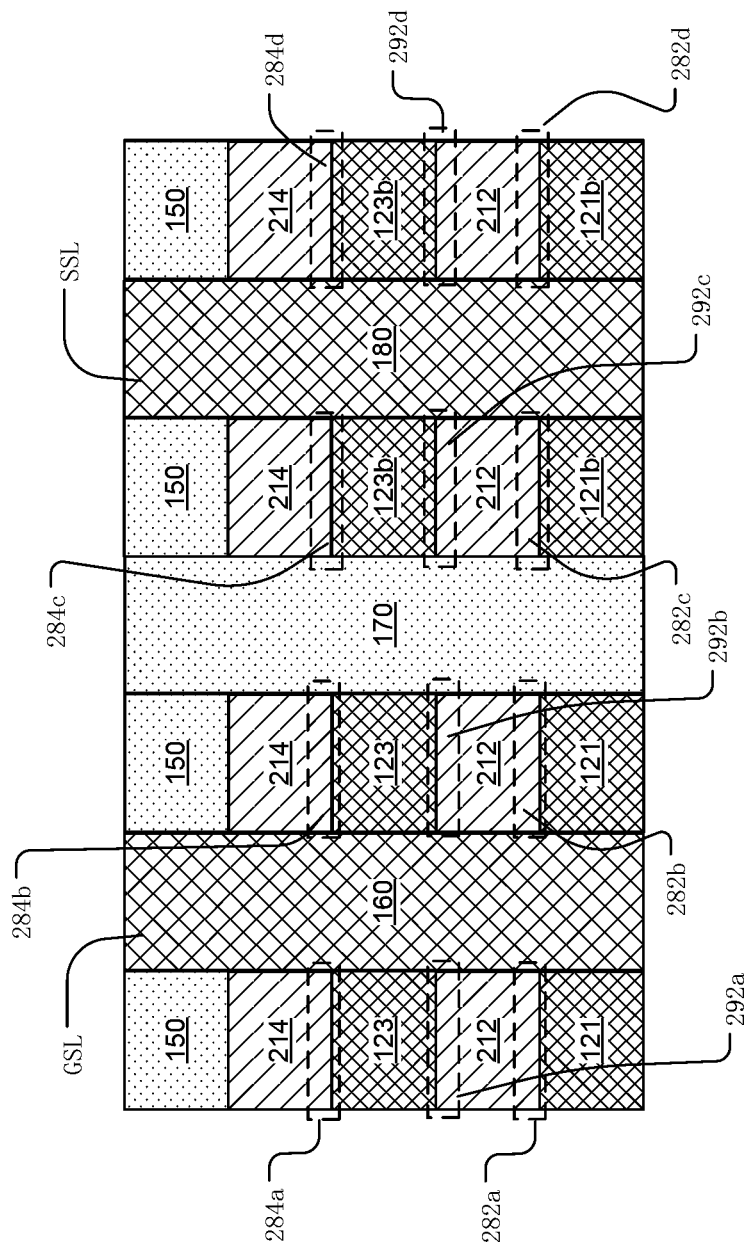
FIG. 3 is a side view diagram of a stack in the device in FIG. 1.

FIG. 3 is a side view diagram of the stack 110, taken along a direction orthogonal to the cross-section shown in FIG. 2. In FIG. 3, the gate dielectric layer 150 is shown on the insulating line 115 and an insulating element 170, while removed from the semiconductor lines 114 and 112 to expose the strips of semiconductor material 214 and 212. Elements in FIG. 3 corresponding to elements in FIG. 1 and FIG. 2 are labeled with the same reference numerals.

FIG. 3 shows one side of the SSL gate structure spaced away along the stack from the GSL gate structure. The GSL gate structure may be used for ground select lines, while the SSL gate structure may be used for string select lines. The SSL gate structure includes a vertical portion 180 adjacent the stack on the at least one side, and horizontal extension portions 121b and 123b on both sides of the vertical portion 180. The horizontal extension portions 123b are in the recesses between the semiconductor lines 114 and 112 including the strips of semiconductor material 214 and 212. The horizontal extension portions 121b are in the recesses between the semiconductor line 112 including the strip of semiconductor material 212 and the substrate at the bottom of the stack.

As illustrated in FIG. 3, the GSL gate structure includes a vertical portion 160 adjacent the stack on the at least one side, and horizontal extension portions 123 and 121 on both sides of the vertical portion 160. The horizontal extension portions 123 are in the recesses between the strips of semiconductor material 214 and 212. The horizontal extension portions 121 are in the recesses between the strip of semiconductor material 212 and the substrate at the bottom of the stack.

The device includes an insulating element 170 between the horizontal extension portions of the SSL gate structure and the horizontal extension portions of the GSL gate structure. The insulating element 170 blocks the path between the GSL gate structure and the SSL gate structure. Thus the insulating element 170 may block the paths between the horizontal extension portions 123 and 123b, and between the horizontal extension portions 121 and 121b.

When voltage is applied to the GSL gate structure (vertical portion 160 and horizontal extension portions 121 and 123) to turn on the GSL switch, the channel regions in the strips of semiconductor material 212, 214 adjacent to the vertical portion 160 turn on and, in addition, inversion layers in areas 282a-282b are induced in the strip of semiconductor material 212 along the upper edges of the horizontal extension portions 121, inversion layers in areas 292a-292b are induced in the strip of semiconductor material 212 along the lower edges of the horizontal extension portion 123, and inversion layers in areas 284a-284b are induced in the strip of semiconductor material 214 along the upper edges of the horizontal extension portion 123. The horizontal extension portions of the GSL gate structure increase the length of the inversion region along the strips of semiconductor material 212 and 214, as compared to a length of an inversion region formed with a GSL gate structure that only has a vertical portion but without the horizontal extension portions as described herein.

Similarly, when voltage is applied to the SSL gate structure (vertical portion 180 and horizontal extension portions 121b and 123b) to turn on the SSL switch, the channel regions in the strips of semiconductor material 212, 214 adjacent to the vertical portion 180 turn on and, in addition, inversion layers in areas 282c-282d are induced in the strip of semiconductor material 212 along the upper edges of the horizontal extension portions 121b, inversion layers in areas 292c-292d are induced in the strip of semiconductor material 212 along the lower edges of the horizontal extension portion 123b, and inversion layers in areas 284c-284d are induced in the strip of semiconductor material 214 along the upper edges of the horizontal extension portions 123b.

Figure 4:
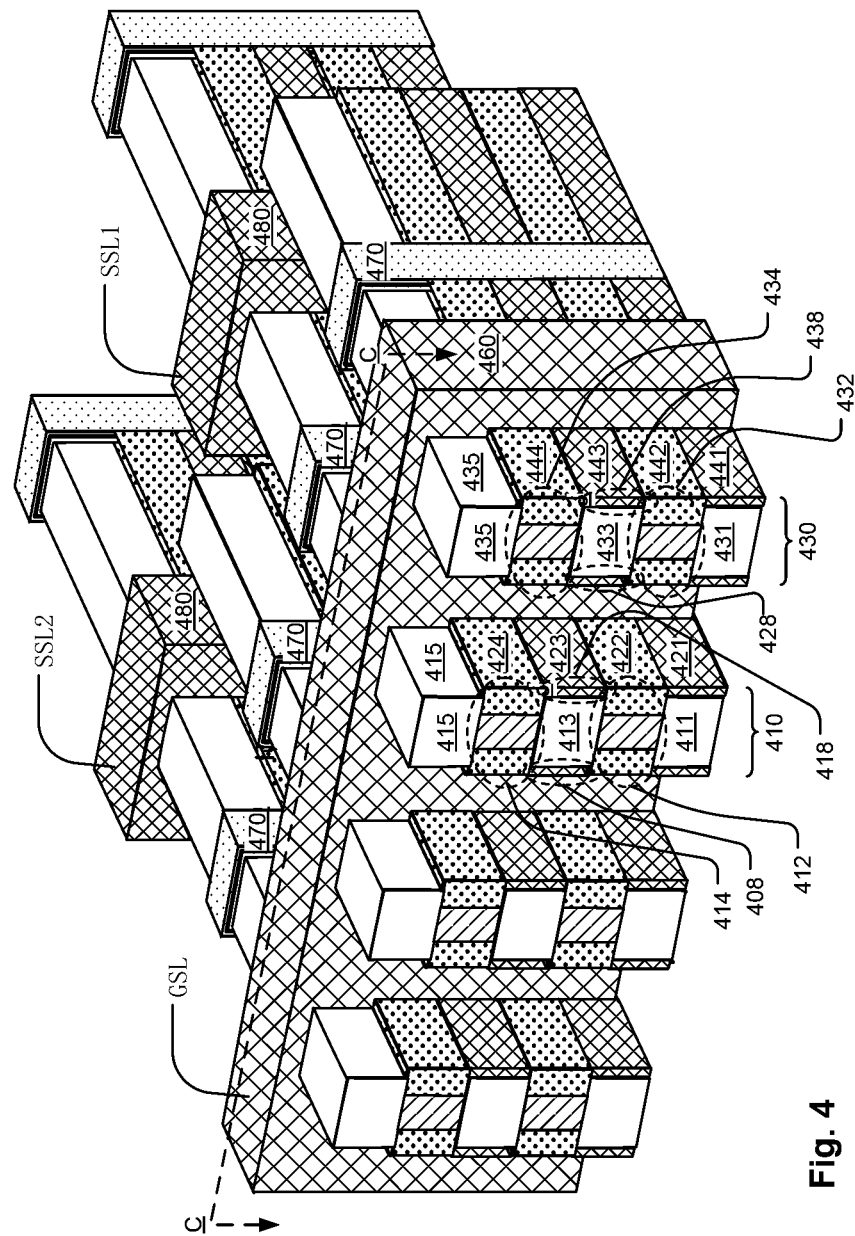
FIG. 4 is a perspective diagram illustrating stacks of semiconductor lines on an integrated circuit with gate structures in an alternative embodiment of the present invention.

FIG. 4 is a perspective diagram illustrating stacks of semiconductor lines on an integrated circuit with gate structures in an alternative embodiment of the present invention. The embodiment may employ a SSL/GSL GOX (string select line/ground select line gate-oxide) approach as described herein. The device includes a stack of alternating semiconductor lines and insulating lines. The semiconductor lines may act as bit lines. For instance, a stack 410 among four stacks shown includes alternating semiconductor lines 412 and 414 and insulating lines 411, 413, and 415, while a stack 430 includes alternating semiconductor lines 432 and 434 and insulating lines 431, 433, and 435. Sides of the insulating lines are recessed relative to sides of the semiconductor lines in the example, so at least one side of the stack includes recesses between semiconductor lines. For instance, sides of the insulating lines 411, 413, and 415 are recessed relative to sides of the semiconductor lines 412 and 414, so the stack 410 includes recesses 408 and 418 between semiconductor lines 412 and 414. Similarly, sides of the insulating lines 431, 433, and 435 are recessed relative to sides of the semiconductor lines 432 and 434, so the stack 430 includes recesses 428 and 438 between semiconductor lines 432 and 434.

Figure 5:
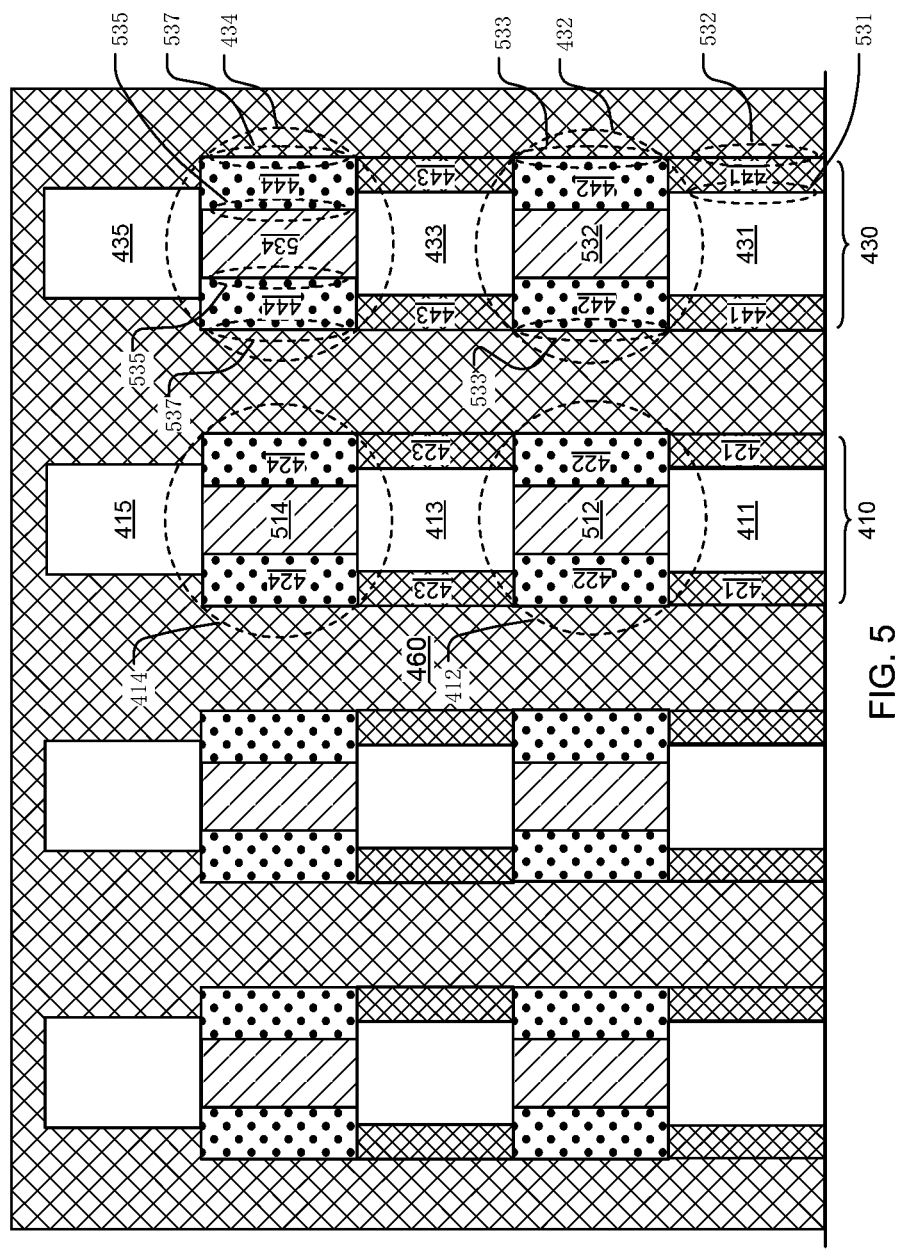
FIG. 5 is a cross-sectional diagram illustrating a cross-section of stacks in the device in FIG. 4.

As illustrated in FIG. 4, semiconductor lines 412, 414, 432, and 434 include a strip of semiconductor material having sides and an insulating layer 422, 424, 442, and 444 on the sides of the semiconductor material, respectively. FIG. 5 further illustrates the semiconductor lines including the strip of semiconductor material.

The device includes gate structures including a GSL gate structure which is part of the GSL line 327 and an SSL gate structure which is part of the SSL gate structure 309 over the stack of semiconductor lines. The gate structure includes a vertical portion adjacent the stack on the at least one side, and horizontal extension portions in the recesses between the semiconductor lines. In some embodiments, the horizontal extension portions may not be within recesses.

As illustrated in FIG. 4, the gate structure includes a vertical portion 460 adjacent the stack 430, and a horizontal extension portion 443 between the semiconductor lines 432 and 434, preferably in the recess 438. The vertical portion 460 is also adjacent the stack 410, and the stack 410 includes a horizontal extension portion 423 in the recess 418 between the semiconductor lines 412 and 414. The stack 410 and the stack 430 may include additional horizontal extension portions such as horizontal extension portions 421 and 441, between semiconductor lines 412 and 432 and the substrate at the bottom of the stacks.

FIG. 5 is a cross-sectional diagram illustrating a cross-section of stacks in the device of FIG. 4, taken along the line CC over the GSL gate structure and the stacks. Elements in FIG. 5 corresponding to elements in FIG. 4 are labeled with the same reference numerals. FIG. 5 illustrates semiconductor lines 412, 414, 432, and 434 including a strip of semiconductor material 512, 514, 532, and 534 having sides and an insulating layer 422, 424, 442, and 444 on the sides of the semiconductor material 512, 514, 532, and 534, respectively. Due to gate oxide growth employed in the alternative embodiment, the strips of semiconductor material 512, 514, 532, and 524 in the semiconductor lines 412, 414, 432, and 434 as illustrated in FIG. 5 for the alternative embodiment may have a narrower width than the strip of semiconductor material 212, 214, 232, and 234 in the semiconductor lines as illustrated in FIG. 2 for the first mentioned embodiment.

The semiconductor lines in the stack may include a strip of semiconductor material having sides and an insulating layer on the sides of the semiconductor material. Sides 533 and 537 of the semiconductor lines 432 and 434 are an outside surface of the insulating layer (e.g. 442, 444). As illustrated in FIG. 5, the semiconductor line 434 in the stack 430 may include a strip of semiconductor material 534, which has sides 535, and an insulating layer 444 on the sides 535 of the strip of semiconductor material 534. Sides 537 of the semiconductor line 434 are an outside surface of the insulating layer 444. The insulating layer 444 may include an oxide of the strip of semiconductor material 534.

In the device, the horizontal extension portions have inside surfaces adjacent the sides of the insulating lines, and outside surfaces. The outside surfaces of the horizontal extension portions can be flush with the sides of the semiconductor lines. For instance, in reference to FIG. 5, in the stack 430, the horizontal extension portion 441 has an inside surface 531 adjacent the side of the insulating line 431, and an outside surface 532. The outside surface 532 can be flush with sides 533 and 537 of the semiconductor lines 432 and 434, respectively.

Figure 6:
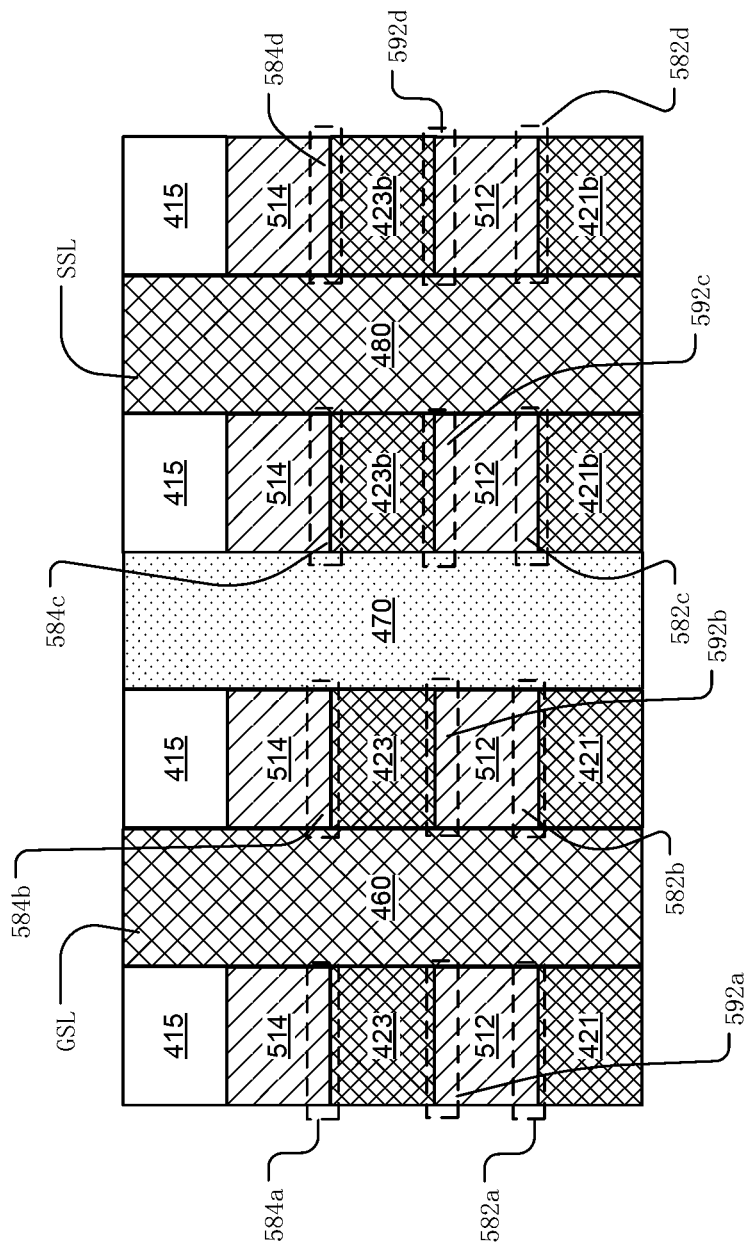
FIG. 6 is a side view diagram of a stack in the device in FIG. 4.
Figure 7:
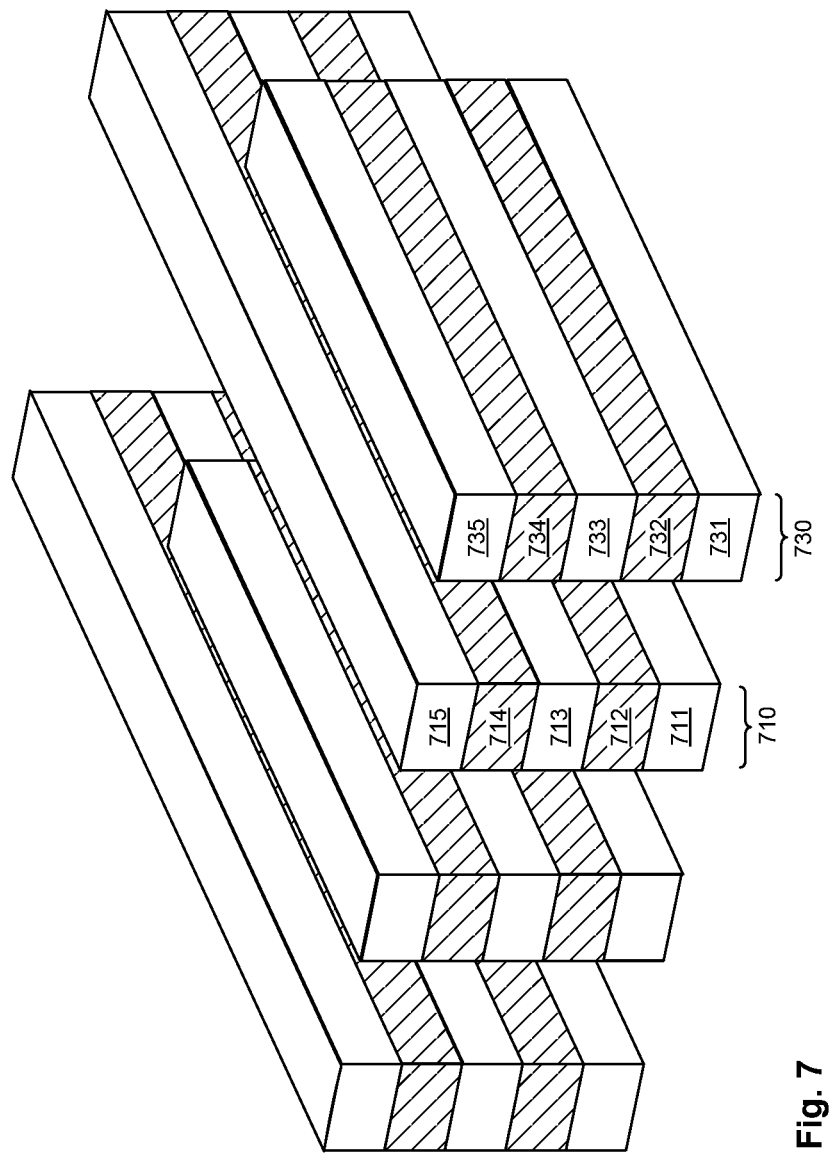
FIGS. 7 through 12 illustrate a method for manufacturing a device on an integrated circuit, in accordance with one embodiment of the present invention.
Figure 8:
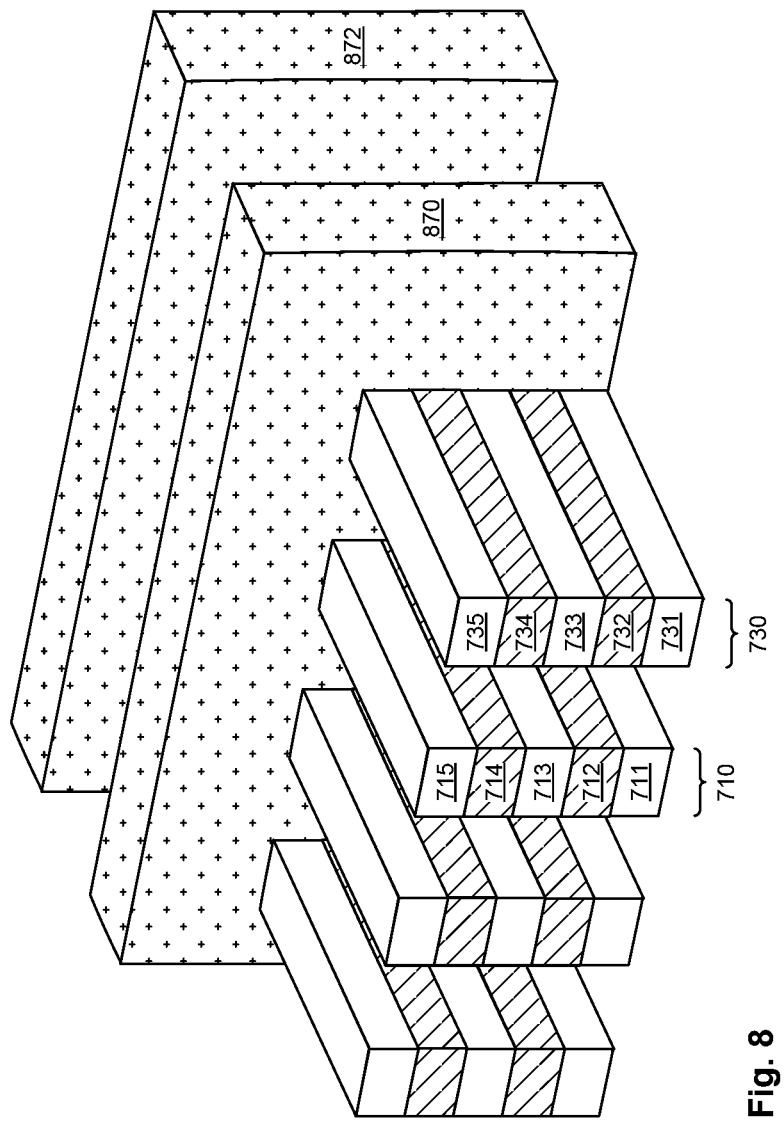

FIG. 6 is a side view diagram of the stack 410, taken along a direction orthogonal to the cross-section shown in FIG. 5. In FIG. 6, the insulating layer 422, 424 is removed from the semiconductor lines 412 and 414 to expose the strips of semiconductor material 512 and 514. Elements in FIG. 6 corresponding to elements in FIG. 4 and FIG. 5 are labeled with the same reference numerals. FIG. 6 is like FIG. 3, but differs in the structure of the insulating element 470. In FIG. 6, the insulating element 470 is formed when the charge storage structures are formed in the memory, and has the same basic multilayer dielectric structure as the charge storage structures. In FIG. 3, the insulating element 170 is a remnant of the dielectric layers (e.g. insulating lines 131, 133, 135) which are etched back to form recesses for the horizontal extension portions, as explained in more detail below.

FIG. 6 shows one side of the SSL gate structure spaced away along the stack from the GSL gate structure. The GSL gate structure may be used for ground select lines, while the SSL gate structure may be used for string select lines. The SSL gate structure includes a vertical portion 480 adjacent the stack on the at least one side, and horizontal extension portions 423b and 421b on both sides of the vertical portion 480. The horizontal extension portions 423b are in the recesses between the semiconductor lines 414 and 412, where the semiconductor lines 414 and 412 include the strips of semiconductor material 514 and 512. The horizontal extension portions 421b are in the recesses between the semiconductor line 412 including the strip of semiconductor material 512 and the substrate at the bottom of the stack.

As illustrated in FIG. 6, the GSL gate structure includes a vertical portion 460 adjacent the stack on the at least one side, and horizontal extension portions 423 and 421 on both sides of the vertical portion 460. The horizontal extension portions 423 are in recesses between the semiconductor lines 414 and 412 including the strips of semiconductor material 514 and 512. The horizontal extension portions 421 are in the recesses between the semiconductor line 412 including the strip of semiconductor material 512 and the substrate at the bottom of the stack.

The device includes an insulating element 470 between the horizontal extension portions of the SSL gate structure and the horizontal extension portions of the GSL gate structure. The insulating element 470 blocks the path between the GSL gate structure and the SSL gate structure. Thus, the insulating element 470 may block the paths between the horizontal extension portions 423 and 423b, and between the horizontal extension portions 421 and 421b.

When voltage is applied to the GSL gate structure (vertical portion 460 and horizontal extension portions 421 and 423) to turn on the GSL switch, the channel regions in the strips of semiconductor material 512 and 514 adjacent to the vertical portion 460 turn on. In addition inversion layers in areas 582a-582b are induced in the strip of semiconductor 512 along the upper edges of the horizontal extension portions 421, inversion layers in areas 592a-592b are induced in the strip of semiconductor material 512 along the lower edges of the horizontal extension portions 423, and inversion layers in areas 584a-584b are induced in the strip of semiconductor material 514 along the upper edges of the horizontal extension portions 423. The horizontal extension portions of the GSL gate structure increase the length of the inversion region along the strips of semiconductor material 512 and 514, as compared to a length of an inversion region formed with a GSL gate structure that only has a vertical portion but without the horizontal extension portions as described herein.

Similarly, when voltage is applied to the SSL gate structure (vertical portion 480 and horizontal extension portions 421b and 423b) to turn on the SSL switch, the channel regions in the strips of semiconductor material 512 and 514 adjacent to the vertical portion 480 turn on. In addition, inversion layers in areas 582c-582d are induced in the strip of semiconductor material 512 along the upper edges of the horizontal extension portions 421b, inversion layers in areas 592c-592d are induced in the strip of semiconductor material 512 along the lower edges of the horizontal extension portions 423b, and inversion layers in areas 584c-584d are induced in the strip of semiconductor material 514 along the upper edges of the horizontal extension portions 423b.

FIGS. 7 through 12 illustrate a method for manufacturing a device on an integrated circuit, in accordance with one embodiment of the present invention. The method includes forming a stack of alternating strips of semiconductor material and insulating lines. The strips of semiconductor material may act as bit lines. In reference to FIG. 7, a stack 710 of alternating strips of semiconductor material 712 and 714 and insulating lines 711, 713, and 715 are formed. A stack 730 of alternating strips of semiconductor material 732 and 734 and insulating lines 731, 733, and 735 are also formed.

Figure 9:
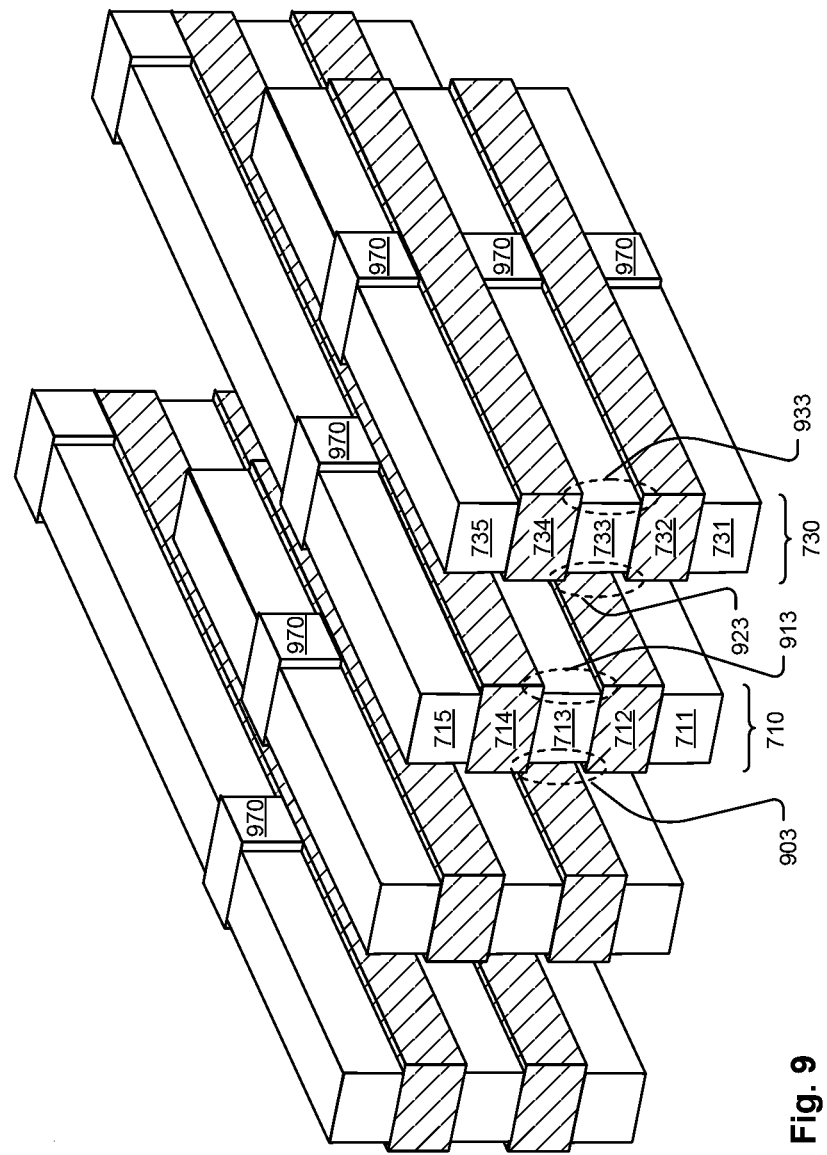
Figure 10:
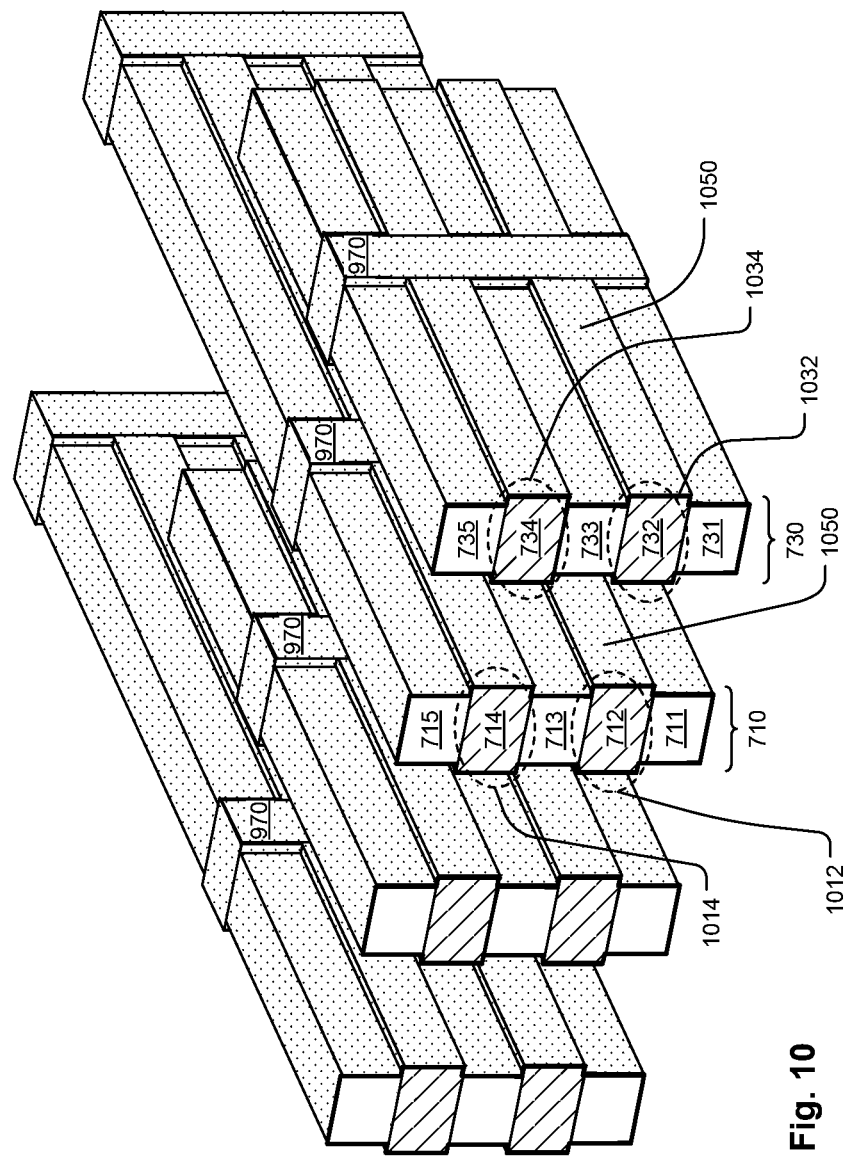

The method may include forming an etch mask over the stack, and etching the stack using the etch mask to define an insulating element. In reference to FIG. 8, etch masks 870 and 872 are formed over the stacks including the stack 710 and the stack 730. The etch masks 870 and 872 prevent a pullback etch from etching portions of the insulating lines in the stack so no recesses are formed in the portions of the insulating lines. The portions of the insulating lines that remain after the pullback etch and after removal of the etch masks form an insulating element 970 as shown in FIG. 9.

The method includes recessing sides of the insulating lines relative to sides of the strips of semiconductor material, so at least one side of the stack includes recesses between the strips of semiconductor material. The recessing may include applying a pullback etch to the insulating lines in the stack to define the recesses between the strips of semiconductor material. In reference to FIG. 9, as a result of applying the pullback etch to the insulating lines, a recess 913 is defined on a side of the insulating line 713, and a recess 903 is defined on an opposing side of the insulating line 713, between strips of semiconductor material 712 and 714. Similarly, a recess 933 is defined on a side of the insulating line 733, and a recess 923 is defined on an opposing side of the insulating line 733, between strips of semiconductor material 732 and 734. The recesses are separated by insulating elements 970 under the masks 870 and 872.

The method may further include depositing a gate dielectric layer on the sides of the strips of semiconductor material. The stack includes semiconductor lines including a strip of semiconductor material having sides, and the gate dielectric layer deposited on the sides of the strips of semiconductor material. The sides of the semiconductor lines are an outside surface of the gate dielectric layer. In reference to FIG. 10, a gate dielectric layer 1050 is deposited on the sides of the strips of semiconductor material 712, and 714, in the stack 710. The gate dielectric layer 1050 is also deposited on the sides of the strips of semiconductor material 732, and 734, in the stack 730. Semiconductor lines 1012 and 1014 in the stack 710 include strips of semiconductor material 712 and 714 having sides, and the gate dielectric layer 1050 deposited on the sides of the strips of semiconductor material 712 and 714. Semiconductor lines 1032 and 1034 in the stack 730 include strips of semiconductor material 732 and 734 having sides, and the gate dielectric layer 1050 deposited on the sides of the strips of semiconductor material 732 and 734. The gate dielectric layer 1050 may be a multilayer dielectric, such as an oxide-nitride-oxide (ONO) dielectric material, used in memory cells for charge storage.

Figure 11:
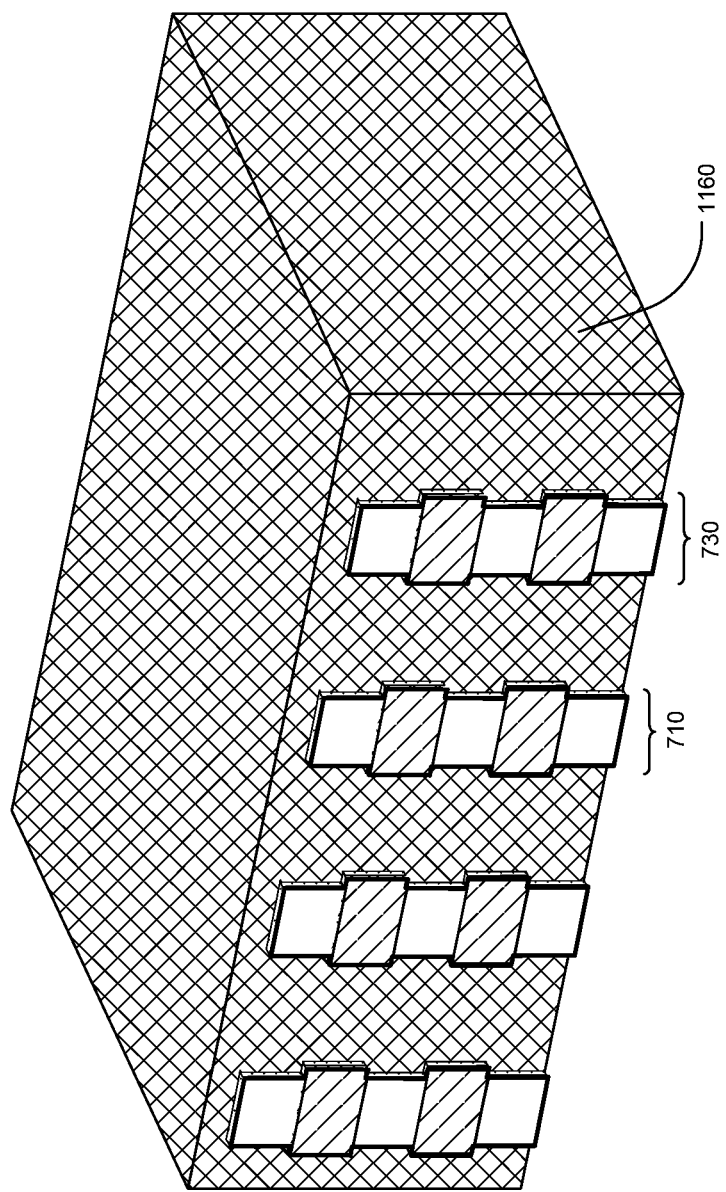

The method includes depositing a gate material 1160 over the stacks, including the stack 710 and the stack 730, as illustrated in FIG. 11. The gate material 1160 can be polysilicon, metal, multilayer conductive material, or other type of gate material.

The method includes using a patterned etch of the gate material 1160 to define the gate structures over the stack of semiconductor lines. The gate structures include a GSL gate structure which is part of the GSL line 327 (FIG. 1A) and an SSL gate structure 1280 which is part of the SSL gate structure 309 (FIG. 1A) over the stack of semiconductor lines. The patterned etch can be done using anisotropic etching which does not remove gate material from the recesses. As a result, the gate structure includes a vertical portion adjacent the stack on the at least one side, and horizontal extension portions in the recesses between the semiconductor lines. The horizontal extension portions have inside surfaces adjacent the sides of the insulating lines, and outside surfaces. The method includes etching the horizontal extension portions and the semiconductor lines such that the outside surfaces of the horizontal extension portions can be flush with the sides of the semiconductor lines.

Figure 12:
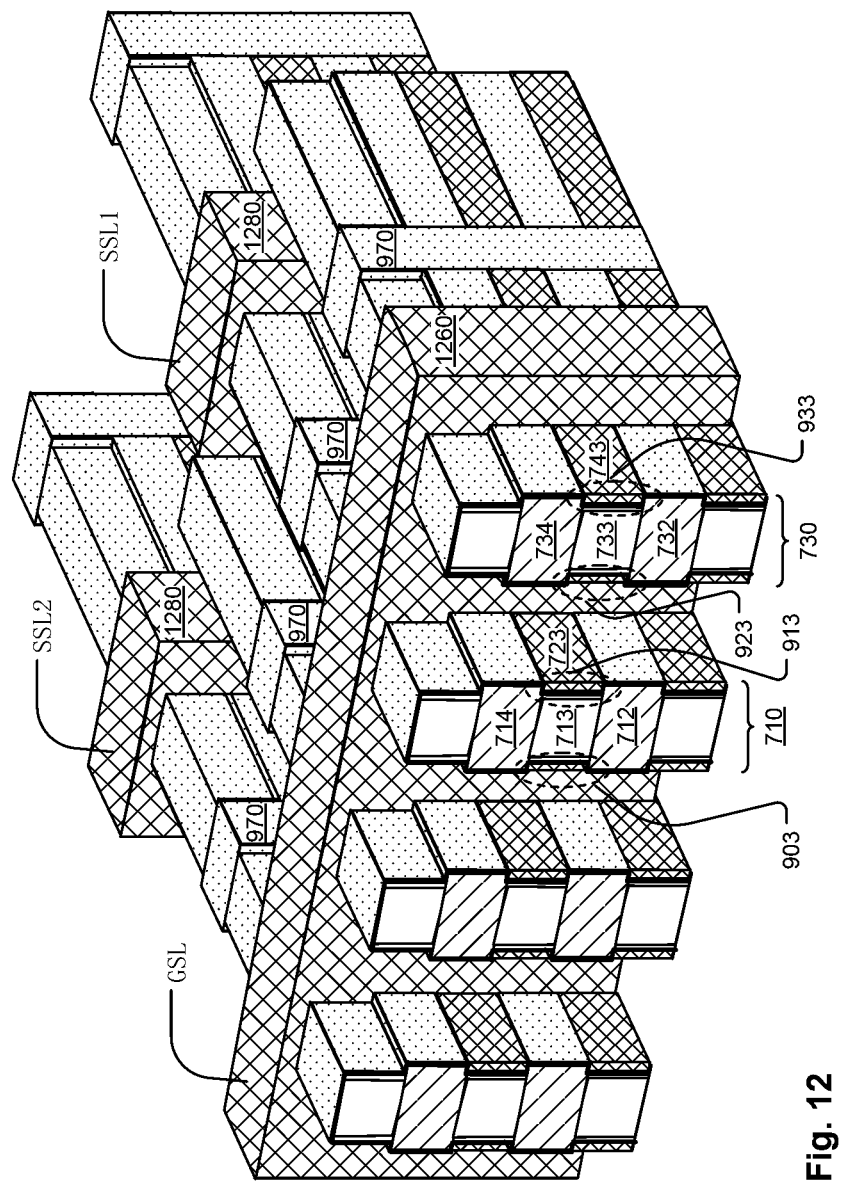
Figure 13:
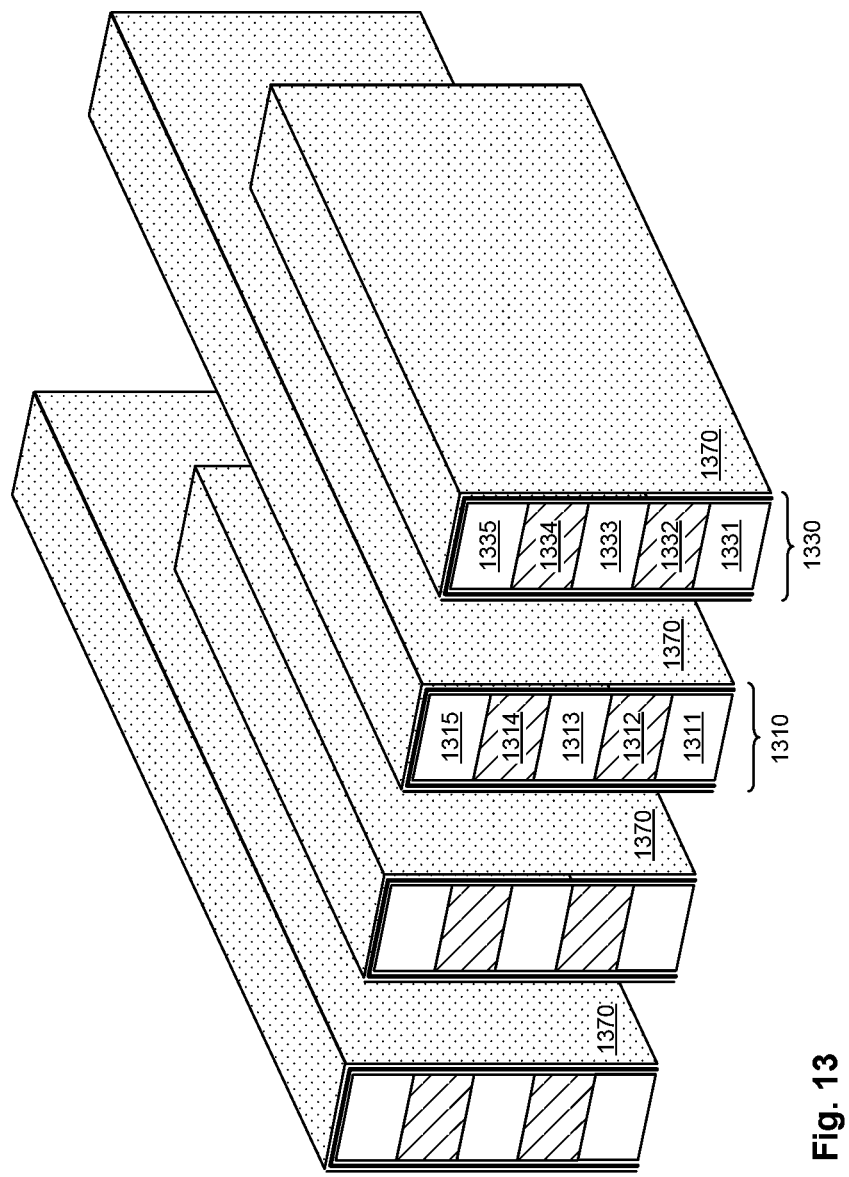
FIGS. 13 through 18 illustrate a method for manufacturing a device on an integrated circuit, in accordance with an alternative embodiment of the present invention.
Figure 14:
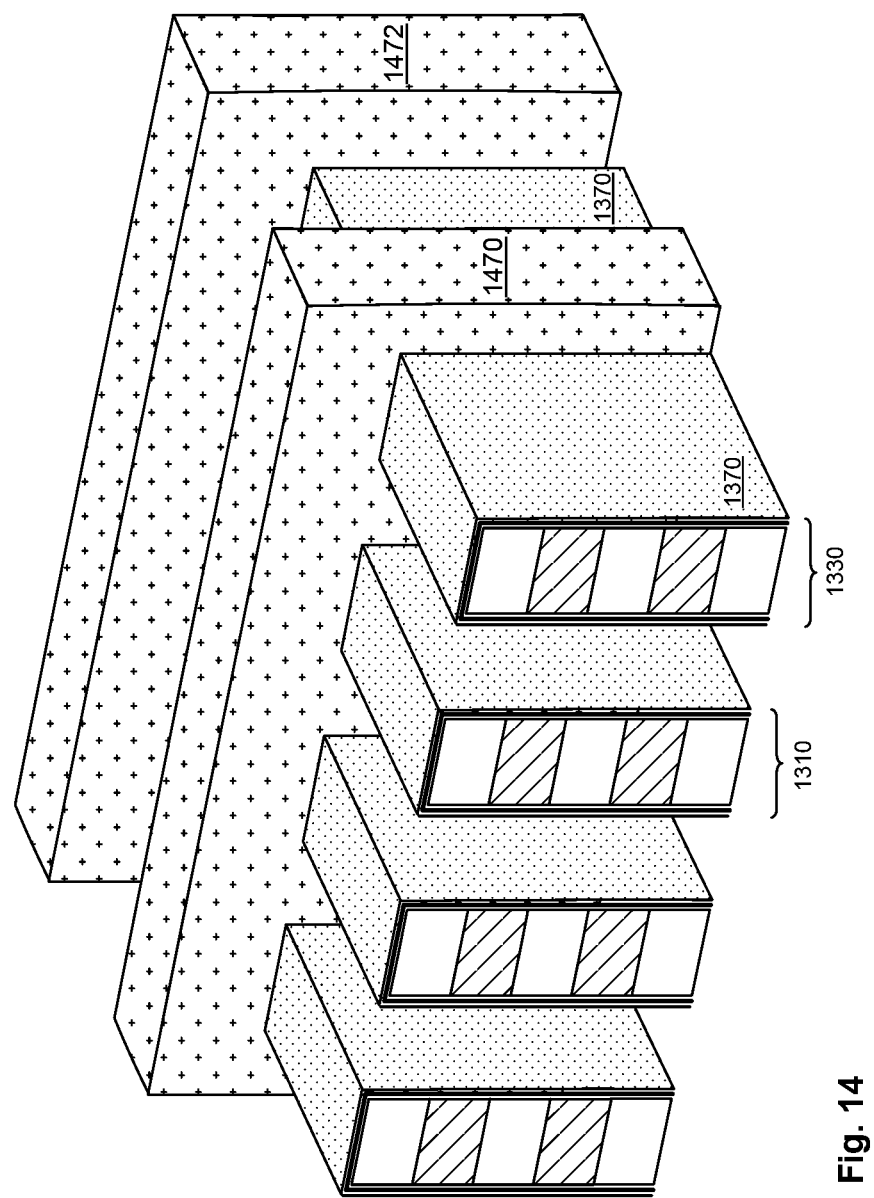

In reference to FIG. 12, the gate structure includes a vertical portion 1260 adjacent the stack 710 and the stack 730. For the stack 710, the gate structure includes a horizontal extension portion 723 in the recess 913, and another horizontal extension portion (obscured by other parts of the figure) in the recess 903, between the strips of semiconductor material 712 and 714. For the stack 730, the gate structure includes a horizontal extension portion 743 in the recess 933, and another horizontal extension portion (obscured by other parts of the figure) in the recess 923, between the strips of semiconductor material 732 and 734.

FIGS. 13 through 18 illustrate a method for manufacturing a device on an integrated circuit, in accordance with an alternative embodiment of the present invention. The method includes forming a stack of alternating strips of semiconductor material and insulating lines. The strips of semiconductor material may act as bit lines. In reference to FIG. 13, a stack 1310 of alternating strips of semiconductor material 1312 and 1314 and insulating lines 1311, 1313, and 1315 are formed. A stack 1330 of alternating strips of semiconductor material 1332 and 1334 and insulating lines 1331, 1333, and 1335 are also formed. The method may include depositing a dielectric layer 1370 over the stacks including the stack 1310 and 1330. The dielectric layer 1370 may be a multilayer dielectric, such as an oxide-nitride-oxide (ONO) dielectric material, used in memory cells for charge storage.

Figure 15:
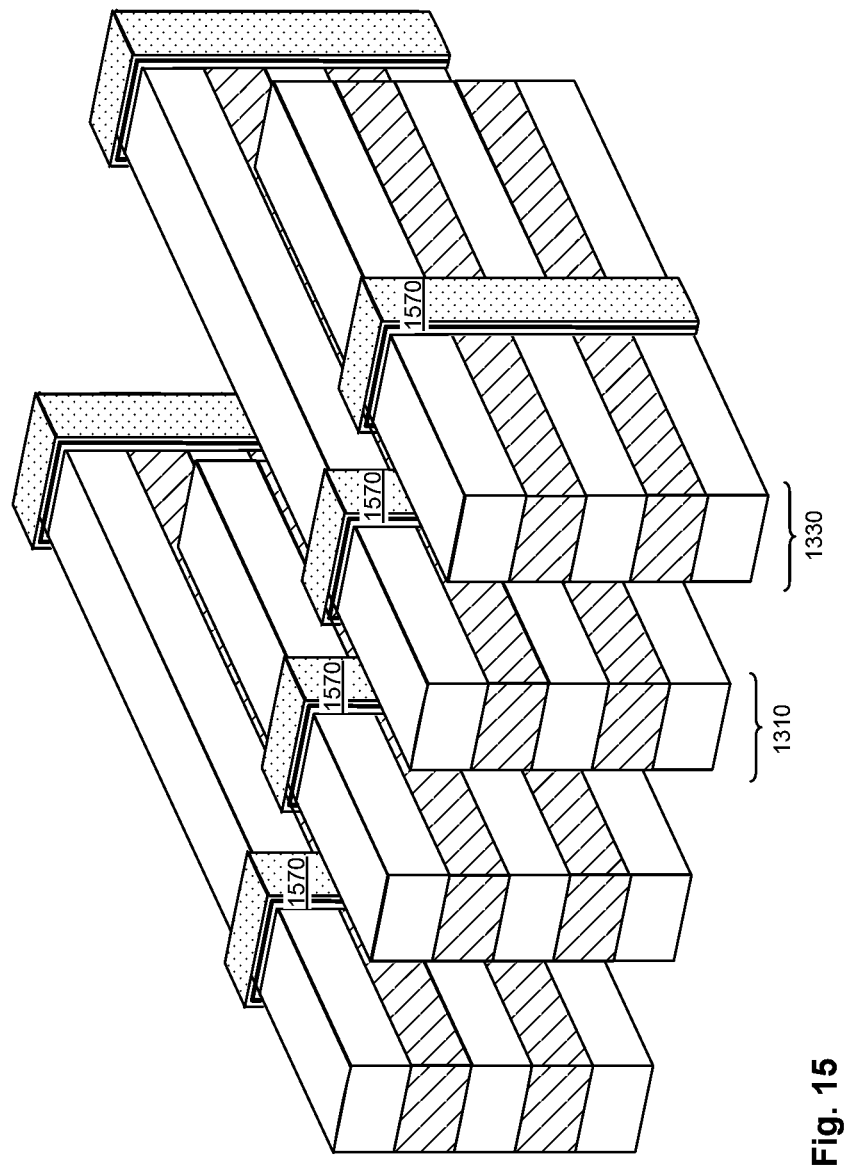
Figure 16:
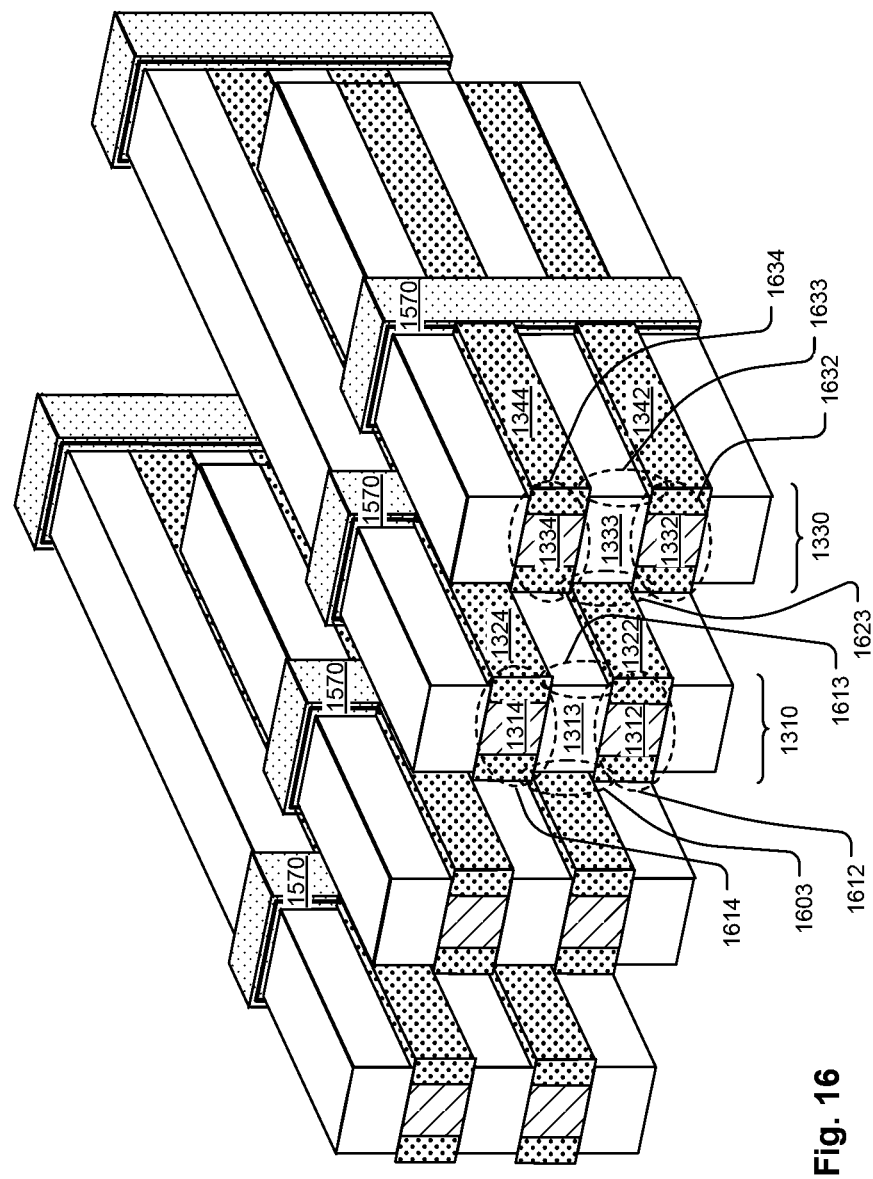

The method may include forming an etch mask over the stack, and etching the stack using the etch mask to define an insulating element. In reference to FIG. 14, etch masks 1470 and 1472 are formed over the stacks including the stack 1310 and the stack 1330, after the deposition of the dielectric layer 1370 on the stacks. The etch masks 1470 and 1472 prevent a patterned etch from etching portions of the dielectric layer 1370 on the stack. The patterned etch removes portions of the dielectric layer 1370 that are not under the etch masks 1470 and 1472 from the stacks, and subsequently removes the etch masks 1470 and 1472, resulting in an insulating element 1570 over the stacks as shown in FIG. 15.

The method may further include forming an insulating layer on the sides of the strips of semiconductor material, including oxidizing the sides of the strips of semiconductor material. In reference to FIG. 16, semiconductor lines 1612 and 1614 in the stack 1310 include strips of semiconductor material 1312 and 1314 having sides, and an insulating layer 1322 and 1324 formed on the sides of the strips of semiconductor material 1312 and 1314, respectively, such as by oxidizing the sides of the strips of semiconductor material. The semiconductor lines 1632 and 1634 in the stack 1330 include strips of semiconductor material 1332 and 1334 having sides, and an insulating layer 1342 and 1344 formed on the sides of the strips of semiconductor material 1332 and 1334, respectively. As a result of forming the insulating layer on the sides of the strips of semiconductor material, a recess 1613 is defined on a side of the insulating line 1313, and a recess 1603 is defined on an opposing side of the insulating line 1313, between the semiconductor lines 1612 and 1614. Similarly, a recess 1633 is defined on a side of the insulating line 1333, and a recess 1623 is defined on an opposing side of the insulating line 1333, between semiconductor lines 1632 and 1634.

Figure 17:
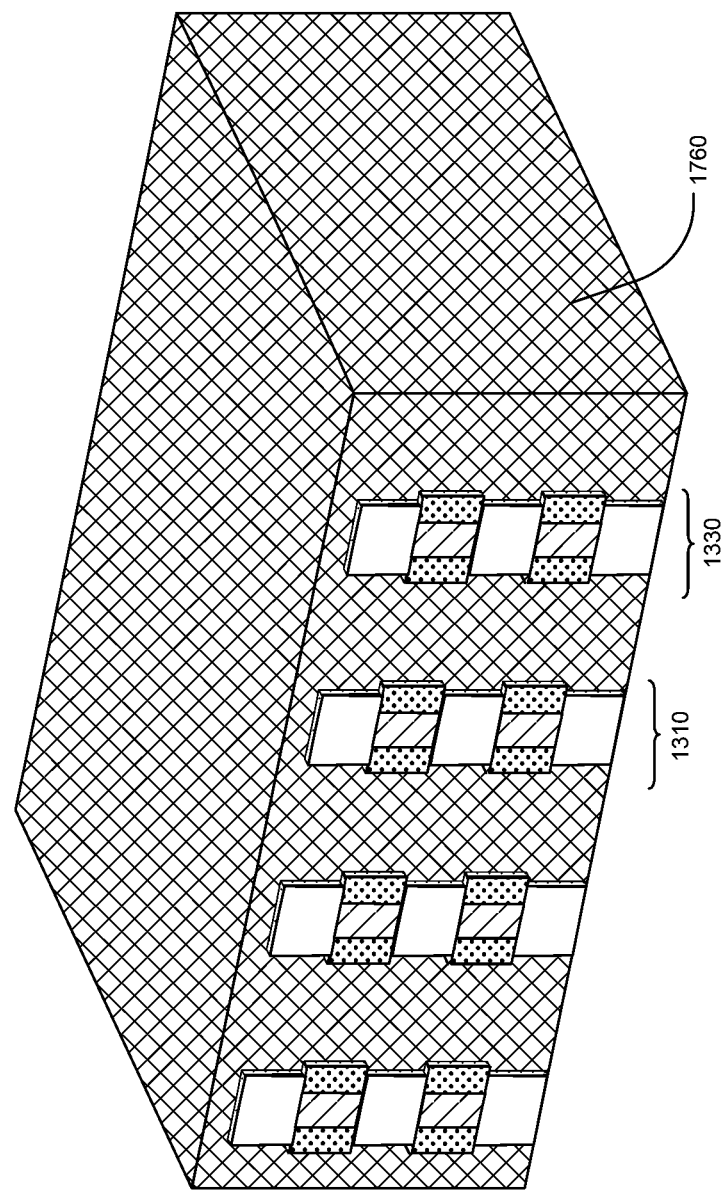

The method includes depositing a gate material 1760 over the stacks, including the stack 1310 and the stack 1330, as illustrated in FIG. 17. The gate material 1160 can be polysilicon, metal, multilayer conductive material, or other type of gate material.

The method includes using a patterned etch of the gate material 1760 to define the gate structures over the stack of semiconductor lines. The gate structures include a GSL gate structure which is part of the GSL line 327 (FIG. 1A) and an SSL gate structure 1880 which is part of the SSL gate structure 309 (FIG. 1A) over the stack of semiconductor lines. The patterned etch can be done using anisotropic etching which does not remove gate material from the recesses. As a result, the gate structure includes a vertical portion adjacent the stack on the at least one side, and horizontal extension portions in the recesses between the semiconductor lines. The horizontal extension portions have inside surfaces adjacent the sides of the insulating lines, and outside surfaces. The method includes etching the horizontal extension portions and the semiconductor lines such that the outside surfaces of the horizontal extension portions can be flush with the sides of the semiconductor lines, where the sides of the semiconductor lines are an outside surface of the insulating layer formed on the strips of semiconductor material in the semiconductor lines.

Figure 18:
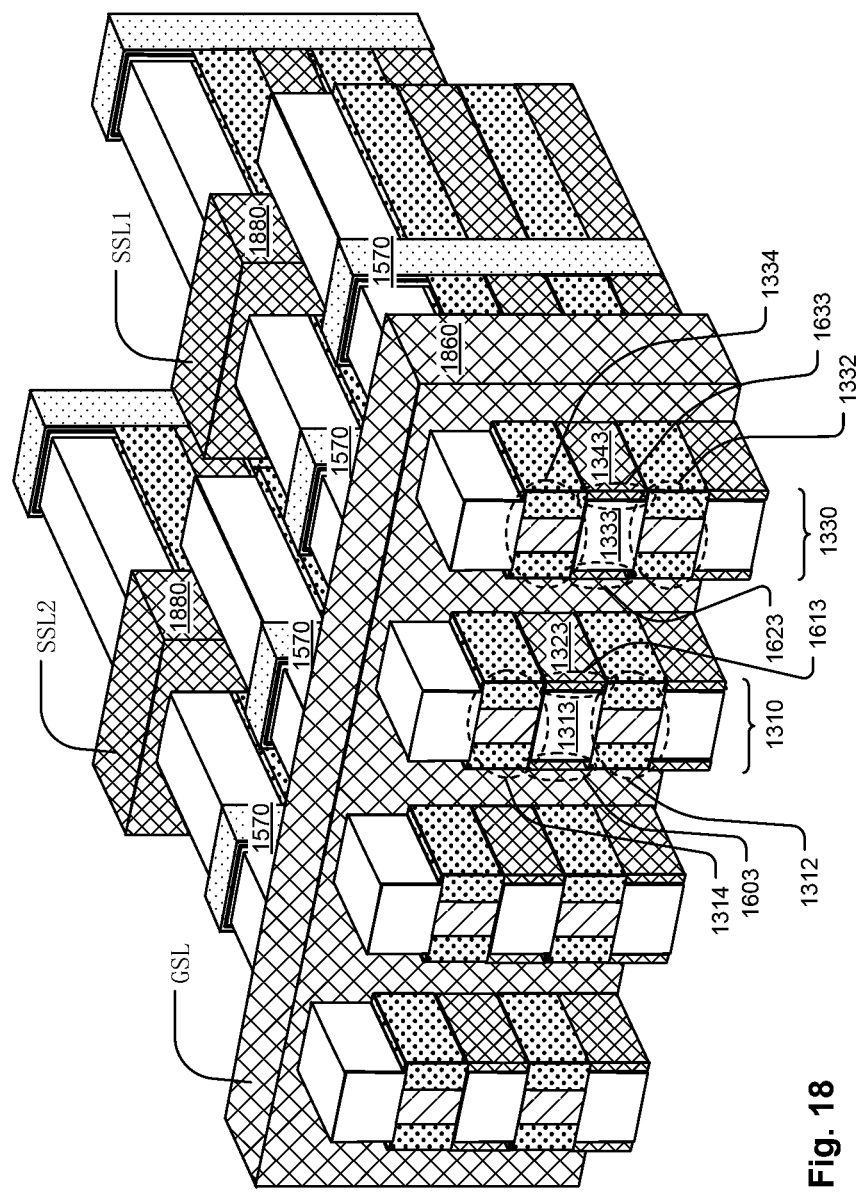

In reference to FIG. 18, the gate structure includes a vertical portion 1860 adjacent the stack 1310 and the stack 1330. For the stack 1310, the gate structure includes a horizontal extension portion 1323 in the recess 1613, and another horizontal extension portion (obscured by other parts of the figure) in the recess 1603, between the strips of semiconductor material 1312 and 1314. For the stack 1330, the gate structure includes a horizontal extension portion 1343 in the recess 1633, and another horizontal extension portion (obscured by other parts of the figure) in the recess 1623, between the strips of semiconductor material 1332 and 1334.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A device on an integrated circuit, comprising:
   a stack of alternating semiconductor lines and insulating lines; and
   a gate structure over the stack of semiconductor lines, the gate structure including a vertical portion adjacent the stack on at least one side of the stack, and horizontal extension portions between the semiconductor lines.

2. The device of claim 1, wherein sides of the insulating lines are recessed relative to sides of the semiconductor lines, so said at least one side of the stack includes recesses between the semiconductor lines, and the horizontal extension portions of the gate structure are at least partly in the recesses.

3. The device of claim 2, wherein semiconductor lines in the stack include a strip of semiconductor material having sides and a gate dielectric layer on the sides of the semiconductor material, said sides of the semiconductor lines being an outside surface of the gate dielectric layer.

4. The device of claim 2, wherein the horizontal extension portions have inside surfaces adjacent the sides of the insulating lines, and outside surfaces, the outside surfaces being flush with the sides of the semiconductor lines.

5. The device of claim 2, wherein semiconductor lines in the stack include a strip of semiconductor material having sides and an insulating layer on the sides of the semiconductor material, said sides of the semiconductor lines being an outside surface of the insulating layer.

6. The device of claim 5, wherein the insulating layer comprises an oxide of the semiconductor material.

7. The device of claim 1, including a second gate structure spaced away from said first mentioned gate structure, the second gate structure including a vertical portion adjacent the stack on said at least one side, and horizontal extension portions between the semiconductor lines; and
an insulating element between the horizontal extension portions of the second gate structure and the horizontal extension portions of said first mentioned gate structure.

8. The device of claim 7, wherein sides of the insulating lines are recessed relative to sides of the semiconductor lines, so at least one side of the stack includes recesses between semiconductor lines, and the horizontal extension portions of the second gate structure are at least partly in the recesses.

9. The device of claim 8, wherein the horizontal extension portions of the second gate structure have inside surfaces adjacent the sides of the insulating lines, and outside surfaces, the outside surfaces being flush with the sides of the semiconductor lines.

10. A memory device including a three dimensional array of nonvolatile memory cells, comprising:
    an integrated circuit substrate;
    a plurality of stacks of alternating semiconductor lines and insulating lines in multiple planes on the integrated circuit substrate;
    a plurality of string select gate structures arranged orthogonally over, and having surfaces conformal with, the plurality of stacks, the gate structures including a vertical portion adjacent the stacks on at least one side of the stacks, and horizontal extension portions between the semiconductor lines;
    a plurality of word lines arranged orthogonally over, and having surfaces conformal with, the plurality of stacks; and
    memory elements in interface regions at cross-points between surfaces of the plurality of stacks and the plurality of word lines, arranged in strings on the semiconductor lines between bit line structures and source line structures, wherein:
    the string select gate structures include conductive conformal structures that establish string select devices at cross-points between surfaces of the plurality of stacks and the conductive conformal structures.

11. The memory device of claim 10, wherein sides of the insulating lines are recessed relative to sides of the semiconductor lines, so said at least one side of the stack includes recesses between the semiconductor lines, and the horizontal extension portions of the string select gate structures are at least partly in the recesses.

12. The memory device of claim 11, wherein semiconductor lines in the stack include a strip of semiconductor material having sides and a gate dielectric layer on the sides of the strip of semiconductor material, said sides of the semiconductor lines being an outside surface of the gate dielectric layer.

13. The memory device of claim 11, wherein the horizontal extension portions of the string select structures have inside surfaces adjacent the sides of the insulating lines, and outside surfaces, the outside surfaces being flush with the sides of the semiconductor lines.

14. The memory device of claim 11, wherein semiconductor lines in the stack include a strip of semiconductor material having sides and an insulating layer on the sides of the semiconductor material, said sides of the semiconductor lines being an outside surface of the insulating layer.

15. The memory device of claim 14, wherein the insulating layer comprises an oxide of the semiconductor material.

16. The memory device of claim 10, comprising:
    a ground select gate structure arranged orthogonally over, and having surfaces conformal with, the plurality of stacks, and on ends of the stacks to which the string select gate structures are coupled, the ground select gate structure including a vertical portion adjacent the stacks on said at least one side, and horizontal extension portions between the semiconductor lines; and an insulating element between the horizontal extension portions of the ground select gate structure and the horizontal extension portions of the string select gate structures;

wherein ground select devices are established at crosspoints between surfaces of the plurality of stacks and the ground select gate structure.

17. The device of claim 16, wherein sides of the insulating lines are recessed relative to sides of the semiconductor lines, so at least one side of the stack includes recesses between semiconductor lines, and the horizontal extension portions of the ground select gate structures are at least partly in the recesses.

18. The memory device of claim 17, wherein the horizontal extension portions of the ground select gate structure have inside surfaces adjacent the sides of the insulating lines, and outside surfaces, the outside surfaces being flush with the sides of the semiconductor lines.

19. The memory device of claim 10, comprising:
a bit line structure electrically coupling together the semiconductor lines in a same plane in the multiple planes.

20. The memory device of claim 10, comprising:
a plurality of string select lines arranged over the plurality of stacks, string select lines of the plurality of string select lines electrically coupled to different string select gate structures of the plurality of string select gate structures and a string select line decoder.

* * * * *